(12) United States Patent
Vasos et al.

(10) Patent No.: US 8,456,162 B2
(45) Date of Patent: Jun. 4, 2013

(54) METHODS FOR NUCLEAR MAGNETIC RESONANCE (NMR) OR MAGNETIC RESONANCE IMAGING (MRI) MEASUREMENTS USING LONG-LIVED STATES

(75) Inventors: Paul Romeo Vasos, Lausanne (CH); Arnaud Comment, Lausanne (CH); Riddhiman Sarkar, Prilly (CH); Sami Antoine Jannin, Lausanne (CH); Geoffrey Bodenhausen, Paris (FR)

(73) Assignees: Bruker BioSpin AG, Faellanden (CH); Ecole Polytechnique Fédérale de Lausanne (EPFL), Lausanne (CH)

( * ) Notice: Subject to any disclaimer, the term of this patent is extended or adjusted under 35 U.S.C. 154(b) by 430 days.

(21) Appl. No.: 12/662,723

(22) Filed: Apr. 30, 2010

(65) Prior Publication Data

US 2011/0001475 A1 Jan. 6, 2011

(30) Foreign Application Priority Data

Jul. 3, 2009 (EP) .................................. 09164545

(51) Int. Cl.
*G01V 3/00* (2006.01)
(52) U.S. Cl.
USPC ........................................................ 324/309
(58) Field of Classification Search
USPC ................................................. 324/300–322
See application file for complete search history.

(56) References Cited

U.S. PATENT DOCUMENTS

2011/0050228 A1* 3/2011 Levitt et al. .................. 324/310

OTHER PUBLICATIONS

L.B. Becerra, G.J. Gerfen, R.J. Temkin, D.J. Singel + R.G. Griffin, "Dynamic Nuclear-Polarization with a Cyclotron-Resonance Maser at 5-T", Phys. Rev. Lett. 71, 3561-3564 (1993).
M.J. Prandolini, V.P. Denysenkov, M. Gafurov, B. Endeward + T.F. Prisner, "High-field dynamic nuclear polarization in aqueous solutions", J. Am. Chem. Soc. 131, 6090-2 (2009).
J.H.Ardenkjaer-Larsen, B.Fridlund, A.Gram, G.Hansson, L.Hansson, M.H.Lerche, R.Servin, M.Thaning + K. Golman, "Increase in signal-to-noise ratio of >10,000 times in liquid-state NMR", Proc. Nat. Acad. Sci.100, 10158-10163 (2003).
M. Carravetta, O.G. Johannessen + M.H. Levitt, "Beyond the $T_1$ limit: Singlet nuclear spin states in low magnetic fields", Phys. Rev. Lett. 92, 153003 (2004).
P. Ahuja, R. Sarkar, P.R. Vasos + G. Bodenhausen "Molecular Properties Determined from the Relaxation of Long-Lived Spin States", J. Chem. Phys. 127, 134112 (2007).
M. Carravetta + M.H. Levitt, "Long-lived nuclear spin states in high-field solution NMR", J. Am. Chem. Soc. 126, 6228-6229 (2004).

(Continued)

*Primary Examiner* — Melissa Koval
*Assistant Examiner* — Daniel Miller
(74) *Attorney, Agent, or Firm* — Paul Vincent

(57) ABSTRACT

A method for nuclear magnetic resonance (NMR) or magnetic resonance imaging (MRI) measurements, includes creation of enhanced polarization of nuclei of a first kind within a sample in a magnetic field at cryogenic temperatures and transfer of the polarized sample to room temperature. The enhanced polarization of nuclei of the first kind is thereby transformed into long-lived states (LLS) of nuclei of a second kind and these LLS are sustained. The LLS is at least partially converted into observable magnetization and an NMR or MRI measurement is carried out. The method allows one to extend the time needed between hyperpolarized magnetization and NMR detection.

17 Claims, 3 Drawing Sheets

OTHER PUBLICATIONS

G.Pileio, M. Concistré, M.Carravetta + M.H. Levitt, "Long-lived nuclear spin states in the solution NMR of four-spin systems", J. Magn. Reson. 182, 353-347 (2006).

G. Pileio + M.H. Levitt, "J-Stabilisation of singlet states in the solution NMR of multiple-spin systems", J. Magn. Reson. 187, 141-145 (2007).

E.Vinogradov + A.K.Grant, "Long-lived states in solution NMR: Selection rules for instramolecular dipolar relaxation in low magnetic fields", J. Magn. Reson. 188, 176-182 (2007).

E.Vinogradov + A.K. Grant, "Hyperpolarized long-lived states in solution NMR: Three-spin case study in low field", J. Magn. Reson. 194, 46-57 (2008).

D.Canet, S.Bouguet-Bonnet, C.Aroulanda + F.Reineri, "About long-lived nuclear spin states involved in para-hydrogenated molecules", J. Am. Chem. Soc. 129, 1445-9(2007).

P.Ahuja, R. Sarkar, P.R. Vasos + G.Bodenhausen, "Long lived states in multiple-spin systems", Chemphyschem, 10, 2217-2220 (2009).

S.Cavadini, J.Dittmer, S.Antonijevic + G.Bodenhausen, "Slow diffusion by singlet state NMR spectroscopy", J. Am. Chem. Soc. 127, 15744-15748 (2005).

S.Cavadini + P.R. Vasos, "Singlet states open the way to longer time-scales in the measurement of diffusion by NMR spectroscopy", Concepts Magn. Reson. 32A, 68-78 (2008).

R.Sarkar, P.Ahuja, P.R. Vasos + G.Bodenhausen, "Measurement of Slow Diffusion Coefficients of Molecules with Arbitrary Scalar couplings via Long-Lived Spin States", ChePhysChem 9, 2414-2419 (2008).

R.Sarkar, P.R.Vasos + G.Bodenhausen, "Singlet-State Exchange NMR Spectroscopy for the Study of Very Slow Dynamic Processes", J. Am. Chem. Soc. 129, 328-334 (2007).

W.S.Warren, E. Jenista, R.T.Branca + X.Chen, "Increasing Hyperpolarized Spin Lifetimes Through True Singlet Eigenstates", Science 323, 1711-1714 (2009).

G.Golman, J.H.Ardenaer-Larsen, J.S.Petersson, S.Mansson + I.Leunbach, "Molecular imging with endogenous substances", Proc. Nat. Acad. Sci. 100, 10435-10439 (2002).

A.Comment, B.Van Den Brandt, K.Uffmann, F.Kurdzesau, S.Jannin, J.A.Konter, P.Hautle, W.T.H.Wenckebach, R.Gruetter + J.J.Van Der Klink, "Design and performance of a DNP prepolarizer coupled to a rodent MRI scanner", Concepts Magn. Reson. 318,255-269 (2007).

R.Sarkar, P.Ahuja, D.Moskau, P.R.Vasos + G.Bodenhausen, "Extending the scope of singlet-state spectroscopy", ChemPhysChem 8, 2652-2656 (2007).

D.P.Burum + R.R.Ernst, "Net Polarization Transfer Via a J-Ordered State for Signal Enhancement of Low-Sensitivity Nuclei", J. Magn. Reson. 39, 163-168 (1980).

G.A.Morris + R.Freeman, "Enhancement of Nuclear Magnetic-Resonance Signals by Polarization Transfer", J. Am. Chem. Soc. 101, 760-762 (1979).

P.Ahuja, R.Sarkar, P.R.Vasos + G.Bodenhausen, "Diffusion Coefficients of Biomolecules Using Long-Lived Spin States", J. Am. Chem. Soc. 131, 7498-7499 (2009).

Chekmenev, Eduard, Y. et al., "Hyperpolarized (1)H NMR Employing Low gamma Nucleus for Spin Polarization Storage", Journal of the American Chemical Society, Mar. 11, 2009, vol. 131, No. 9, pp. 3164-3165.

Vasos, P.R. et al., "Long-lived states to sustain hyperpolarized magnetization", Proceedings of the National Academy of Sciences of the United States of America, Nov. 3, 2009, vol. 106, No. 44, pp. 18469-18473.

\* cited by examiner state of the art - Fig. 1

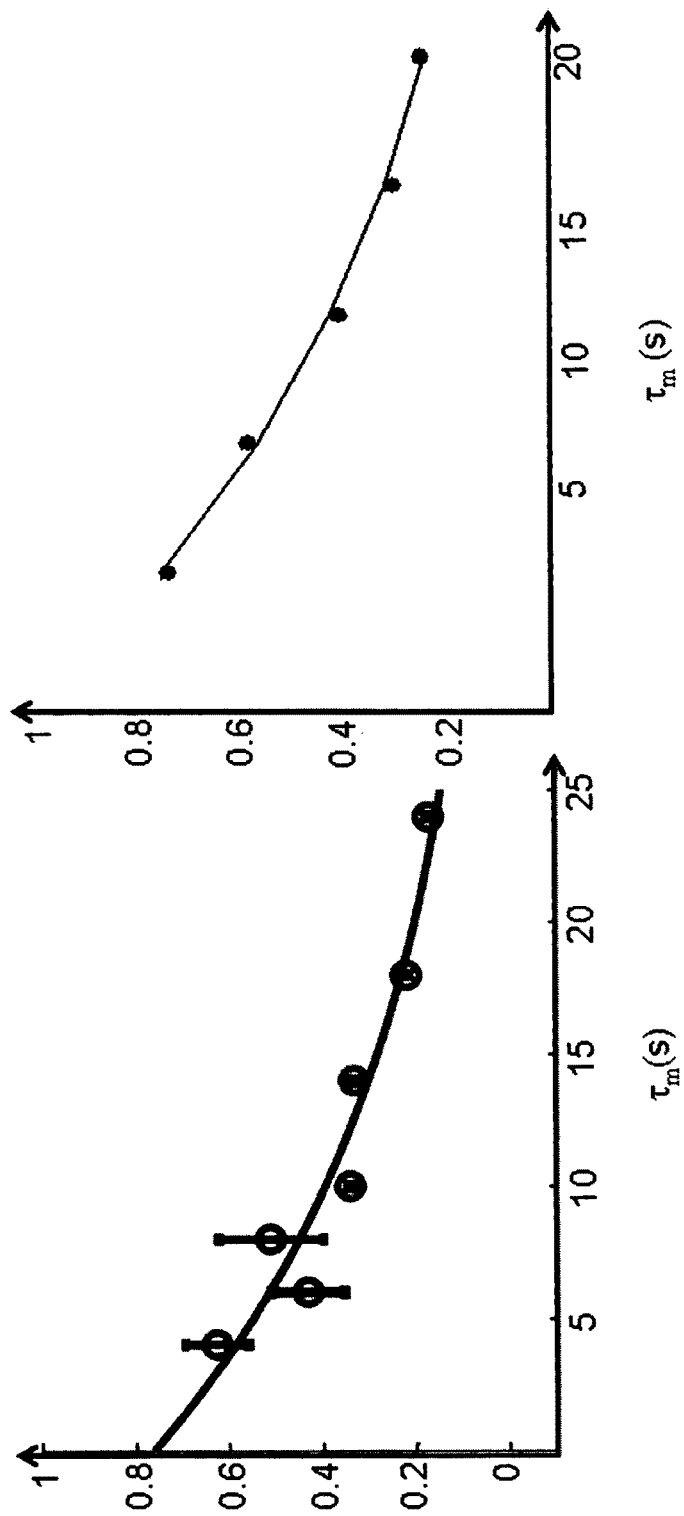

METHODS FOR NUCLEAR MAGNETIC RESONANCE (NMR) OR MAGNETIC RESONANCE IMAGING (MRI) MEASUREMENTS USING LONG-LIVED STATES

This application claims Paris Convention priority to EP 09 164 545.7 filed Jul. 3, 2009 the entire disclosure of which is hereby incorporated by reference.

BACKGROUND OF THE INVENTION

The invention concerns a method for nuclear magnetic resonance (NMR) or magnetic resonance imaging (MRI) measurements, comprising the steps:
(i) creation of enhanced polarisation of nuclei of a first kind within a sample in a magnetic field at cryogenic temperatures; and
(ii) transfer of the polarised sample to room temperature.

A method as described above is known from reference 3.

The limited sensitivity of magnetic resonance spectroscopy (MRS) and magnetic resonance imaging (MRI) experiments may be considerably improved by coupling the nuclear spins to energy states affording a larger polarisation such as those of electron spins, whereby "polarisation" is used as synonym for "longitudinal magnetisation". Nuclear hyperpolarisation using the nucleus-electron spin-spin coupling may be achieved in two ways: (i) in-situ DNP experiments for polarisation enhancement in the magnet where signal detection is performed. These experiments can be performed repetitively at short time intervals in solid samples using gyrotrons[1] or in liquid samples[2] by relying on the Overhauser effect; (ii) ex-situ experiments, such as dissolution DNP[3], where the polarisation of electron spins is transferred to nuclei in a polarising magnet prior to NMR one-shot detection in a high-resolution magnet. This approach can yield enhancements of up to four orders of magnitude, but since it takes a long time to build up the enhanced polarisation at temperatures of ca. 1.2 K, one can typically only perform a few experiments per day. The intrinsically short lifetimes of hyperpolarised polarisation, normally determined by the longitudinal relaxation time constants $T_1$, compel one to make use of the enhanced polarisation quickly, within intervals of the order of a few tens of seconds. Therefore, reactions or transport phenomena that occur on longer time scales cannot be followed using dissolution DNP.

The longitudinal relaxation times $T_1$ of the populations of ordinary Zeeman states of spins I=½ are usually limited by dipole-dipole couplings and anisotropic chemical shifts, both modulated by molecular tumbling. The dipolar interaction is often the dominant source of relaxation. It has been shown by Levitt and co-workers[4,6] that this mechanism may be silenced under particular circumstances, by rendering the spins equivalent, either through the application of a suitable radio frequency (rf) irradiation, or by the removing the sample from the magnetic field. Spin order, under these conditions, may be preserved as long-lived states (LLS), which, in the simple case of a system consisting of two coupled spins ½, correspond to a difference between the populations, on the one hand, of the singlet state $$S_0 = \frac{1}{\sqrt{2}}(|\alpha\beta\rangle - |\beta\alpha\rangle)$$

and, on the other hand, of the mean population of the three triplet states $$T_{+1} = |\alpha\alpha\rangle, \; T_0 = \frac{1}{\sqrt{2}}(|\alpha\beta\rangle + |\beta\alpha\rangle), \; \text{and} \; T_{-1} = |\beta\beta\rangle.$$

This difference can be represented by the operator:

$$Q_{LLS} = -N\vec{I}\cdot\vec{S} = -N(I_xS_x + I_yS_y + I_zS_z) = -N(I_zS_z + ZQ_x) \quad (1)$$

with the norm $$N = -\frac{2}{\sqrt{3}}.$$

It has been shown[5,7-12] that long-lived states, i.e., states with lifetimes that are partly immune to dipolar relaxation, can exist in systems which may comprise as many as five coupled spins. These states may be associated with sensitive proton spins in endogenous substances such as glycerol or taurine and a variety of amino acids (Gly, Asp, Asn, Cys), particularly when these belong to mobile parts of proteins. A six-fold increase in the relaxation time constant ($T_{LLS}/T_1=6$) has been determined for glycine residues in the C-terminus of Ubiquitin[13].

Applications have been developed to exploit long-lived spin states for the study of slow diffusion[13-16], exchange[17], and for sustaining enhanced magnetisation[10,11,18].

The latter application has been intensely pursued because of the high costs, both in terms of time and equipment, which are involved in obtaining nuclear hyperpolarisation. Provided the population differences can be enhanced in organic molecules, and provided this polarisation can be sustained during in vivo studies, it may be possible to use endogenous substances to follow metabolic pathways. Increasing the magnetisation lifetime in polarised molecules will also lead to better spatial and temporal resolution in magnetic resonance imaging[19]. Some systems can sustain LLS transferred from the polarisation of para-hydrogen[10,11]. In particular, in molecules featuring chemically equivalent nuclei, spin states with relatively long lifetimes are believed to exist. Their enhanced magnetisation may be converted to detectable magnetisation using hydration reactions[18].

Object of the invention is to present a method for nuclear magnetic resonance (NMR) or magnetic resonance imaging (MRI) measurements that allows one to extend the time needed between hyperpolarised magnetisation and NMR detection.

SUMMARY OF THE INVENTION

This object is achieved by a method according to the independent claim.

The inventive method comprises the steps:
(i) creation of enhanced polarisation of nuclei of a first kind within a sample in a magnetic field at cryogenic temperatures, whereby "enhanced polarisation" (hyperpolarisation) means a polarisation which is enhanced with respect to the natural polarisation according to Boltzmann's law;
(ii) transfer of the polarised sample to room temperature, i.e. a change of temperature of the sample (in situ preparation), but it may also comprise moving of the sample from a preparation area to a measuring area in an NMR magnet (ex-situ preparation);

(iii) transformation of the enhanced polarisation of nuclei of the first kind into long-lived states (LLS) of nuclei of a second kind;
(iv) sustaining these LLS;
(v) at least partial conversion of the LLS into observable magnetisation, i.e magnetisation which is detectable by MR measurements (transverse magnetisation); and
(vi) carrying out an NMR or MRI measurement.

Until recently, longitudinal relaxation time constants ($T_1$) were believed to set an upper time limit for the study of slow processes by NMR. It has recently been found that the magnetisation of scalar-coupled groups of spins can be converted into long-lived states (LLS) with lifetimes $T_{LLS}$ that can be much longer than $T_1$. This opens a potential for preserving spin order for longer times, with demonstrated applications to store polarisation enhanced using Dynamic Nuclear Polarisation (DNP) and to study slow diffusion, flow or exchange. The methods are illustrated by preserving DNP-enhanced magnetisation associated with sensitive proton spins in an Ala-Gly dipeptide during time intervals that are almost an order of magnitude longer than their spin-lattice relaxation time constant $T_1$. By using the inventive method small fractions of the polarisation sustained in the form of LLS can be transformed into observable single-quantum coherences for detection at desired time intervals. This opens a way to follow slow chemical reactions or slow transport by enhanced NMR or MRI.

With the inventive method LLS are excited in systems containing J-coupled spins to preserve polarisation created by hyperpolarisation and these states are converted back to detectable magnetisation. The inventive method shows that the enhanced nuclear polarisation may be stored in so-called long-lived states (LLS[4, 5]), whose extended life-times $T_{LLS}$ relax the constraint on the interval between low-temperature pre-polarisation and room-temperature NMR detection.

Preferably the nuclei of the first kind have a longitudinal relaxation time $T_1$ which is longer than the time required for the transfer of the polarised sample in step (ii), in particular $^{13}$C or $^{15}$N. At the moment transfer requires several seconds.

In a highly preferred variant the nuclei of the second kind are protons.

In an advantageous variant of the inventive method in step (iv) LLS are sustained by irradiation of the sample with an rf-field, which is less cumbersome than sustaining LLS by taking the sample out of the magnetic field.

In a highly preferred variant in step (v) the LLS are only partially converted into detectable magnetisation, and after carrying out step (v) the remaining part of the LLS (=part of the LLS which has not yet been converted into detectable magnetisation) is sustained during the subsequent period, prior to another detection period, and steps (iv) through (vi) are repeated n−1 times, whereby n is an integer number and n>1. Thus it is possible to maintain polarisation of the sample over a long time.

This partial conversion can be achieved by completely converting the LLS into a difference of longitudinal two spin order (ZZ) and zero quantum coherence (ZQC) in step (v) during an interval $\tau_4$, and subsequently partially converting this superposition into detectable magnetisation by applying a small-angle pulse, in particular a pulse with flip angle smaller or equal to 30°.

In an alternative variant in step (v) the LLS are partially converted into a difference of longitudinal two spin order (ZZ) and zero quantum coherence (ZQC) during an interval $\tau_0$, and subsequently entirely converting this superposition into detectable magnetisation by applying a 90° pulse.

A different variant of the inventive method comprises converting the entire amount of LLS into detectable magnetisation in step (v) and not repeating steps (iv) through (vi).

It is preferred that in step (i) the creation of enhanced polarisation is realized by dynamic nuclear polarisation (DNP), in particular dissolution DNP. Although any method for enhancing polarisation can be used, the dissolution-DNP experiments are widely believed to be most useful for magnetic resonance imaging (MRI). However, the intrinsically short spin memory $T_1$ compels one to use the slowly-built enhancement of the polarisation within short time intervals. Therefore, reactions occurring on time scales of tens of seconds or longer cannot be followed using this technique. Storing the enhanced nuclear polarisation in LLS reduces the strain on the time period that is allowed to elapse between polarisation and NMR detection.

The inventive method is preferably used for the study of chemical reactions and slow dynamic phenomena such as flow, diffusion, and exchange.

The invention is shown in the drawing:

BRIEF DESCRIPTION OF THE DRAWING

FIG. 3a shows a fit of the exponential decay of DNP-enhanced magnetisation converted shot-by-shot into LLS, with $T_{LLS} = 15 \pm 2$ s.

FIG. 3b shows the decay monitored using a series of five consecutive detection periods (n=5, $\alpha=10°$) interleaved with intervals $\tau_m = 4$ s where the LLS was sustained.

DESCRIPTION OF THE PREFERRED EMBODIMENT

Figure 1:
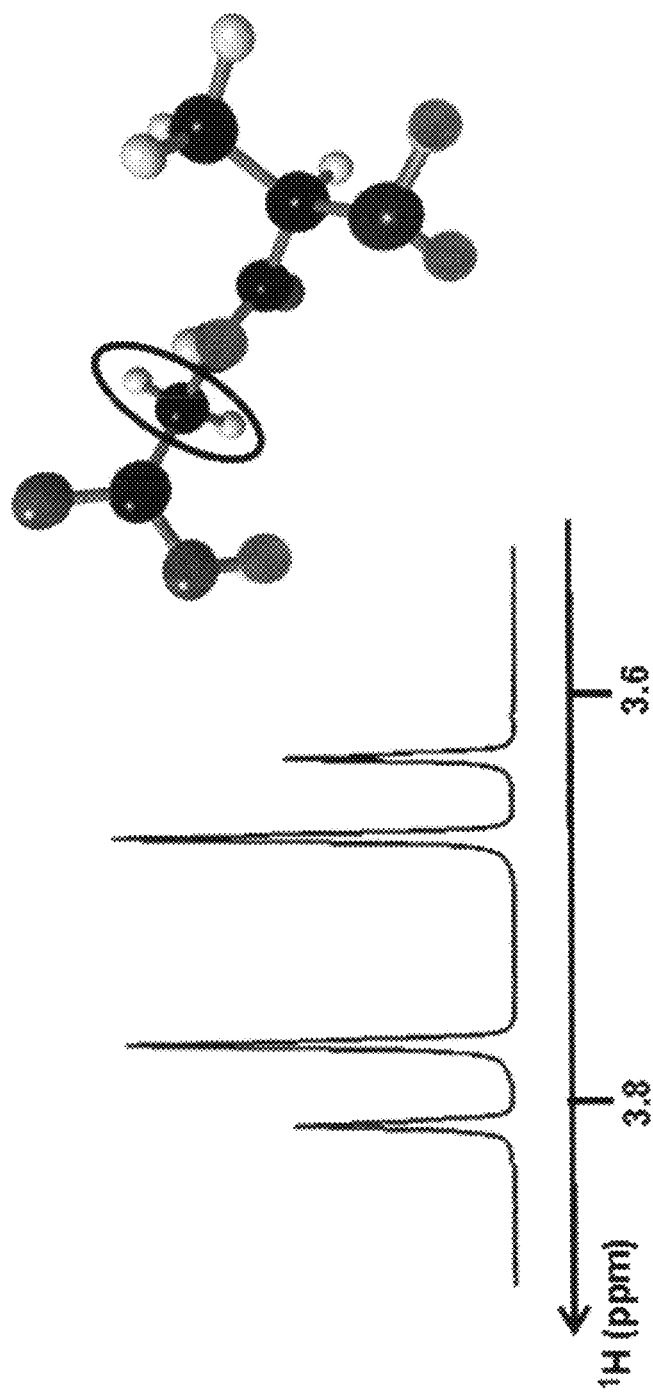
FIG. 1 shows signals of the diastereotopic $CH^\alpha_2$ protons of Gly in L-Ala-Gly (insert) detected following an interval $\tau m=5$ s where LLS were sustained by WALTZ irradiation in $D_2O$ at 300 MHz and 25° C., without signal enhancement by DNP.

A method has been designed to convert a small fraction of LLS into detectable magnetisation. The dipeptide Ala-Gly was chosen to demonstrate this method. The J-coupled aliphatic protons $H^{\alpha 1}$ and $H^{\alpha 2}$ of glycine in Ala-Gly are diastereotopic and therefore apt to sustain long-lived states (FIG. 1). An experiment where an LLS comprising the two protons I=$H^{\alpha 1}$ and S=$H^{\alpha 2}$ is created starting from DNP enhanced $^{13}$C polarisation, sustained, and finally converted into detectable magnetisation[17, 21] yields a proton spectrum (FIG. 1) showing two in-phase doublets with a coupling constant $J_{IS}=-17.4$, centered at the chemical shifts of the $H^{\alpha 1}$ and $H^{\alpha 2}$ protons. The lifetime of the LLS in Ala-Gly in water at room temperature has been found to be $T_{LLS}=42.2\pm0.1$ s, i.e., nearly 25 times longer than their spin-lattice relaxation time $T_1(^1H)=1.712\pm0.002$ s (i.e., $T_{LLS}/T_1=24.6$), provided the concentration of paramagnetic oxygen in the sample is reduced by bubbling nitrogen gas. However, in the sample stemming from a dissolution-DNP procedure this lifetime is shortened by dipolar interactions with paramagnetic oxygen and with the TEMPO radicals required to enhance the polarisation at low temperatures. Under the conditions of the experiments described in Experimental Section, $T_{LLS}=16\pm0.6$ s and $T_1(^1H)=2.3\pm0.2$ s, i.e., $T_{LLS}/T_1=7$ have been measured.

Natural-abundance $^{13}CO$ of glycine (FIG. 1) can be polarised as previously described[20] (see Experimental Section). The enhancement has been estimated to be at least $P=(P_\alpha-P_\beta)/(P_\alpha+P_\beta)=4.6\%$, since the room-temperature signal of the sample after reaching equilibrium was below noise level after 128 scans accumulated using relaxation delays of 200 s. The long spin-lattice relaxation time constant of the quaternary carbons in glycine, $T_1(^{13}CO)=25.9\pm0.2$ s, can be put to good use to transfer the magnetisation from the polarising to the high-resolution magnet.

When used in conjunction with hyperpolarisation, the new experiment comprises four steps: (i) create enhanced polarisation in a low magnetic field at cryogenic temperatures; (ii) rapidly transfer the polarised sample to room temperature; (iii) transform the enhanced carbon-13 magnetisation into long-lived states (LLS) associated with protons and (iv) preserve these LLS by suitable means, (v) 'read out' the long-lived states by (partial) conversion into observable magnetisation. Step (ii) typically lasts a few seconds, so it is advantageous to store polarisation on slowly relaxing nuclei (such as $^{13}C$ nuclei) during this period. Due to the large enhancements afforded by dissolution-DNP, isotope labelling of the molecule of interest is not necessary and naturally-occurring isotopes of nitrogen or carbon (as in the present study) may be used. Step (v) may be repeated if only a small fraction of the long-lived states is converted into detectable terms and the rest is sustained as a long-lived state.

Figure 2:
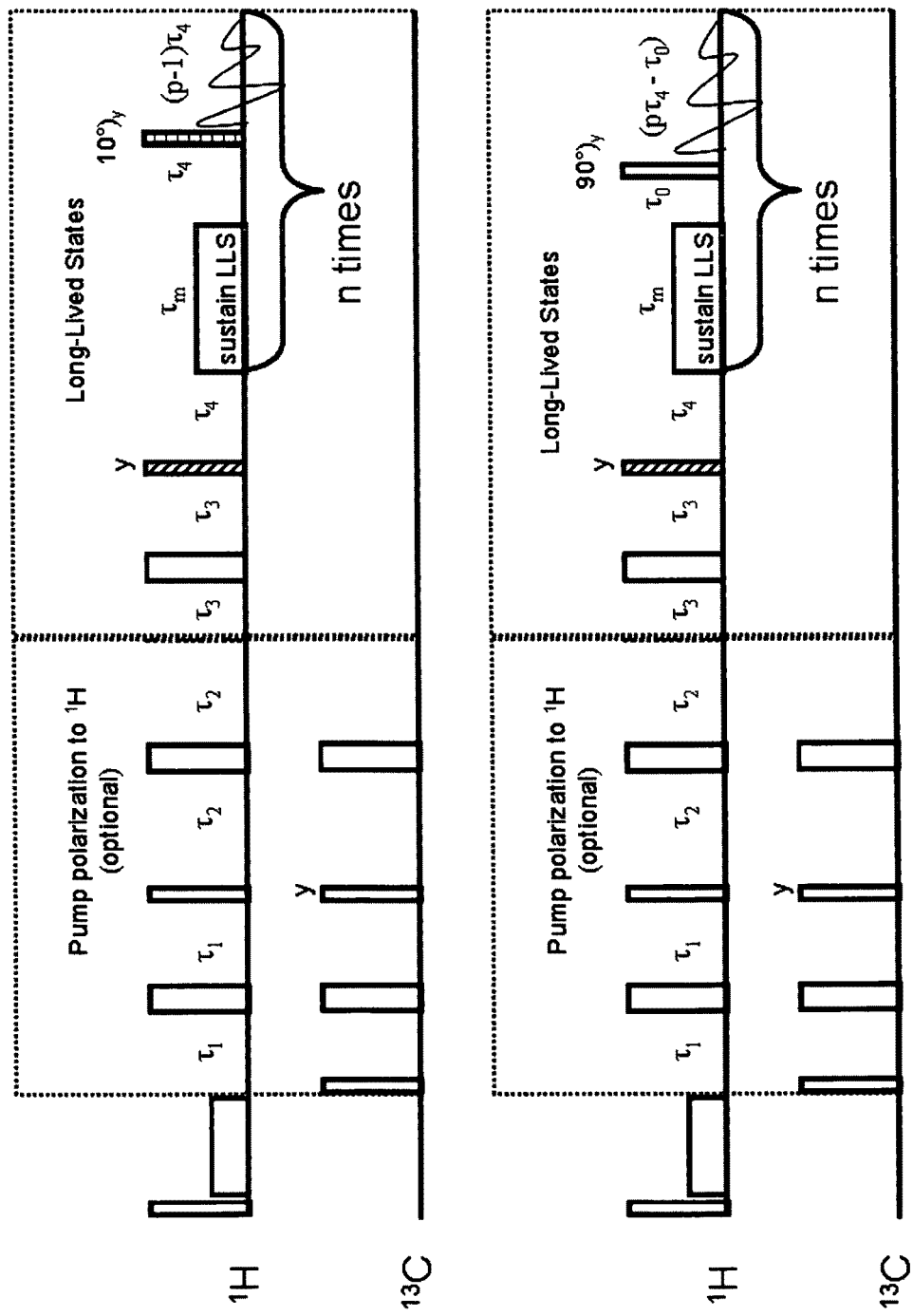
FIG. 2 shows combinations of dissolution DNP with LLS. (Top) Pulse sequence used to convert DNP-enhanced carbon-13 polarisation into proton magnetisation, excite and sustain LLS, achieve a complete conversion into a difference of longitudinal two-spin order and zero quantum coherence, and convert a small fraction thereof into detectable magnetisation using a pulse with a small flip angle, e.g., $\alpha=10°$. (Bottom) Pulse sequence to achieve a partial conversion in a short period $\tau_0$ of LLS into a difference of longitudinal two-spin order and zero quantum coherence, followed by complete transformation of this difference into detectable single-quantum magnetisation. The number p=4 k (with integer k) must satisfy the condition $p\tau_4 \geq 1/J$ so as to obtain sufficient resolution after Fourier transformation of the signal. Horizontally hatched, diagonally hatched, narrow and wide rectangles represent ($\pi/18$), ($\pi/4$), ($\pi/2$), and $\pi$ pulses, respectively. The phases are given when different from x. The delays were $\tau_0 = \arcsin(\pi/18)/(2\pi\Delta\nu_{IS}) \approx 2$ ms, $\tau_1 = 1/[8J(C'H^\alpha)] = 24$ ms, $\tau_2 = 2\tau_1 = 48$ ms, $\tau_3 = 5/[4J(H^{\alpha 1}H^{\alpha 2})] - \tau_2 = 18.1$ ms, $\tau_4 = 1/(4\Delta\nu_{IS}) = 7.2$ ms. In the experiments, k=2 and p=8, and the LLS were sustained during intervals $4 < \tau_m < 25$ s.

The pulse sequence denoted 'Long-Lived States' in FIG. 2 consists of the generation of LLS, sustaining them using rf irradiation, and converting them back to detectable in-phase terms. When the pulse sequence is used in conjunction with DNP, the polarisation is transferred from the carbon to the proton spins in a high-resolution magnet and subsequently converted into LLS. The first proton pulses have the role of saturating any unwanted 'native' proton magnetisation that does not originate in carbon-13 polarisation. The pumping step consists of a refocused inverse-INEPT[22, 23] followed by a spin-echo interval $[\tau_3-\pi-\tau_3]$ to complete the evolution under $J(^1H, ^1H)$ that has started during the $[\tau_2-\pi-\tau_2]$ interval in the preceding INEPT sequence. A 45° pulse converts the antiphase proton coherences into LLS, which are sustained by suitable rf irradiation. If only a fraction of the LLS is converted back into detectable magnetisation by a small-angle pulse, the remaining part may be sustained during a subsequent period, prior to another detection. Two distinct strategies have been explored to this effect:

For the pulse sequence in FIG. 2 (Top):
During the interval $\tau_4=1/(4\Delta\nu_{IS})$ where $\Delta\nu_{IS}=\nu(H^{\alpha 1})-\nu(H^{\alpha 2})$ the $ZQ_x$ part of $Q_{LLS}$ evolves into:

$$ZQ_x \rightarrow ZQ_y = I_yS_x - I_xS_y \quad (2)$$

(Symbols such as ZQ are universally recognized as product operators)[17].

These terms are partly converted into detectable single-quantum coherences by a pulse with a phase y and a small flip angle α:

$$ZQ_y \rightarrow -(I_yS_z - I_zS_y)\sin\alpha + ZQ_y\cos\alpha, \quad (3)$$

The leading antiphase single-quantum terms are detected and the remaining $ZQ_y$ is converted back to $ZQ_x$ during the subsequent interval $p\tau_4-\tau_4$, so that the operator $Q_{LLS}$ is reconstituted.

The pulse sequence in FIG. 2 (Bottom) is based on an alternative approach. During the short interval $\tau_0$ the $ZQ_x$ part of $Q_{LLS}$ evolves to:

$$ZQ_x \rightarrow ZQ_x\cos(2\pi\tau_0\Delta\nu_{IS}) + ZQ_y\sin(2\pi\tau_0\Delta\nu_{IS}) \quad (4)$$

The second term is entirely converted to detectable single-quantum coherences by a 90° pulse:

$$ZQ_y \rightarrow -(I_yS_z - I_zS_y) \quad (5)$$

The remaining $(I_zS_z+ZQ_x)$ part, which commutes with the 90° pulse, is left intact. The $ZQ_x$ term precesses through an even number of periods while detection is performed and LLS may be sustained again after the detection period.

Dissolution

DNP experiments have been performed, followed by the transfer of one or two samples of ca. 1 ml each of polarised sample to the high-resolution magnet. For each sample, a DNP-LLS experiment was performed with variable times $\tau_m$, where the LLS is sustained, n=1, and converting the entire amount of magnetisation into detectable terms. The resulting intensities were scaled by the intensity of the enhanced $^{13}C$ signal, measured in a preliminary experiment using a $^{13}C$ pulse with α=10°, and the ratios $I(DNP-LLS)/I(DNP-^{13}C)$ were fitted to an exponential decay with three parameters (FIG. 3, left panel). The resulting lifetimes were in agreement with the $T_{LLS}$ measured for a similar sample starting from equilibrium room-temperature $^1H$ magnetisation without DNP.

In a second series of experiments (FIG. 3, right panel) long-lived states were sustained during n=5 successive time intervals, each with $\tau_m=4$ s, and a small fraction was converted each time into detectable magnetisation using the method described in FIG. 2 (Top).

The experiments were performed using 0.6 M Ala-Gly mixed with 50 mM TEMPO and dissolved in 5 ml 35%/65% v/v glycerol-d8/$D_2O$. The frozen beads were placed in a home-built prepolariser,[20] and irradiated with 30 mW microwaves at 94 GHz for 5 hours at 1.2 K and 3.35 T. The sample was dissolved in 5 ml $D_2O$ (preheated to 190° C. at 12 bar) to a final concentration of ca. 50 mM. The hyperpolarised solution was transferred to 10 mm tubes maintained at a temperature of 25° C. in an inverse broadband probe in a high-resolution 7 T wide-bore Bruker magnet. The time that elapsed between the start of the transfer from the polarising magnet and detection was ca. 6 s. The room-temperature experiments using nuclear polarisation at Boltzmann equilibrium were carried out at 300 MHz ($B_0$=7.05 T) and 298 K using ~20 mM Ala-Gly solutions in deuterated water. Eight transients were acquired for each LLS experiment using a relaxation delay of 30 s. Experimental relaxation time constants $T_1$ and $T_{LLS}$ were obtained by fitting normalized spectral intensities to mono-exponentially decaying functions. A WALTZ sequence with an rf amplitude $\nu 1$=1.5 kHz was used to sustain the LLS.

For dissolution—DNP experiments, the polarisation of electron spins is transferred to nuclei in a polarising magnet prior to NMR detection in a high-resolution magnet[3], using instrumentation developed at EPFL[20]

The inventive method allows one to preserve DNP-enhanced polarisation under the form of long-lived spin states and to convert small fractions back to detectable terms. This may open the way to follow metabolic pathways by magnetic resonance and providing the time needed for hyperpolarised magnetisation to reach the target areas in angiography studies. The new experiments may find applications for the study of chemical reactions and slow dynamic phenomena such as flow, diffusion, and exchange. Unlike methods that exploit the long lifetimes of nuclei with low gyromagnetic ratios such as carbon-13 and nitrogen-15 to increase the spatial and temporal resolution of MRI[19], the methods described in this work do not require any isotopic labelling, and use the advantageous sensitivity of proton NMR. The new hyperpolarised methods may be extended to multiple scans, phase-cycling and even 2D spectroscopy, provided the partial decay of the LLS is taken into consideration.

REFERENCES

1. L. R. Becerra, G. J. Gerfen, R. J. Temkin, D. J. Singel & R. G. Griffin. Dynamic Nuclear-Polarization with a Cyclotron-Resonance Maser at 5-T. *Phys. Rev. Lett.* 71, 3561-3564 (1993).
2. M. J. Prandolini, V. P. Denysenkov, M. Gafurov, B. Endeward & T. F. Prisner. High-field dynamic nuclear polarization in aqueous solutions. *J Am Chem Soc* 131, 6090-2 (2009).
3. J. H. Ardenkjaer-Larsen, B. Fridlund, A. Gram, G. Hansson, L. Hansson, M. H. Lerche, R. Servin, M. Thaning & K. Golman. Increase in signal-to-noise ratio of >10,000 times in liquid-state NMR. *Proc. Nat. Acad. Sci.* 100, 10158-10163 (2003).
4. M. Carravetta, O. G. Johannessen & M. H. Levitt. Beyond the $T_1$ limit: Singlet nuclear spin states in low magnetic fields. *Phys. Rev. Lett.* 92, 153003 (2004).
5. P. Ahuja, R. Sarkar, P. R. Vasos & G. Bodenhausen. Molecular Properties Determined from the Relaxation of Long-Lived Spin States. *J. Chem. Phys.* 127, 134112 (2007).
6. M. Carravetta & M. H. Levitt. Long-lived nuclear spin states in high-field solution NMR. *J. Am. Chem. Soc.* 126, 6228-6229 (2004).
7. G. Pileio, M. Concistré, M. Carravetta & M. H. Levitt. Long-lived nuclear spin states in the solution NMR of four-spin systems. *J. Magn. Reson.* 182, 353-357 (2006).
8. G. Pileio & M. H. Levitt. J-Stabilisation of singlet states in the solution NMR of multiple-spin systems. *J. Magn. Reson.* 187, 141-145 (2007).
9. E. Vinogradov & A. K. Grant. Long-lived states in solution NMR: Selection rules for intramolecular dipolar relaxation in low magnetic fields. *J. Magn. Reson.* 188, 176-182 (2007).
10. E. Vinogradov & A. K. Grant. Hyperpolarized long-lived states in solution NMR: Three-spin case study in low field. *J. Magn. Reson.* 194, 46-57 (2008).
11. D. Canet, S. Bouguet-Bonnet, C. Aroulanda & F. Reineri. About long-lived nuclear spin states involved in para-hydrogenated molecules. *J. Am. Chem. Soc.* 129, 1445-9 (2007).
12. P. Ahuja, R. Sarkar, P. R. Vasos & G. Bodenhausen. Long lived states in multiple-spin systems. *Chemphyschem* in press (2009).
13. P. Ahuja, R. Sarkar, P. R. Vasos & G. Bodenhausen. Diffusion Coefficients of Biomolecules Using Long-Lived Spin States. *J. Am. Chem. Soc.* 131, 7498-7499 (2009).
14. S. Cavadini, J. Dittmer, S. Antonijevic & G. Bodenhausen. Slow diffusion by singlet state NMR spectroscopy. *J. Am. Chem. Soc.* 127, 15744-15748 (2005).
15. S. Cavadini & P. R. Vasos. Singlet states open the way to longer time-scales in the measurement of diffusion by NMR spectroscopy. *Concepts Magn. Reson.* 32A, 68-78 (2008).
16. R. Sarkar, P. Ahuja, P. R. Vasos & G. Bodenhausen. Measurement of Slow Diffusion Coefficients of Molecules with Arbitrary Scalar Couplings via Long-Lived Spin States. *ChemPhysChem* 9, 2414-2419 (2008).
17. R. Sarkar, P. R. Vasos & G. Bodenhausen. Singlet-State Exchange NMR Spectroscopy for the Study of Very Slow Dynamic Processes. *J. Am. Chem. Soc.* 129, 328-334 (2007).
18. W. S. Warren, E. Jenista, R. T. Branca & X. Chen. Increasing Hyperpolarized Spin Lifetimes Through True Singlet Eigenstates. *Science* 323, 1711-1714 (2009).
19. K. Golman, J. H. Ardenaer-Larsen, J. S. Petersson, S. Mansson & I. Leunbach. Molecular imaging with endogenous substances. *Proc. Nat. Acad. Sci.* 100, 10435-10439 (2003).
20. A. Comment, B. van den Brandt, K. Uffmann, F. Kurdzesau, S. Jannin, J. A. Konter, P. Hautle, W. T. H. Wenckebach, R. Gruetter & J. J. van der Klink. Design and performance of a DNP prepolarizer coupled to a rodent MRI scanner. *Concepts Magn. Reson.* 31B, 255-269 (2007).
21. R. Sarkar, P. Ahuja, D. Moskau, P. R. Vasos & G. Bodenhausen. Extending the scope of singlet-state spectroscopy. *ChemPhysChem* 8, 2652-2656 (2007).
22. D. P. Burum & R. R. Ernst. Net Polarization Transfer Via a J-Ordered State for Signal Enhancement of Low-Sensitivity Nuclei. *J. Magn. Reson.* 39, 163-168 (1980).
23. G. A. Morris & R. Freeman. Enhancement of Nuclear Magnetic-Resonance Signals by Polarization Transfer. *J. Am. Chem. Soc.* 101, 760-762 (1979).

We claim:

1. A method for nuclear magnetic resonance (NMR) or magnetic resonance imaging (MRI) measurements, the method comprising the steps of:
   a) creating enhanced polarisation of nuclei of a first kind within a sample in a magnetic field at cryogenic temperatures;
   b) transferring the polarised sample to room temperature;
   c) transforming the enhanced polarization of nuclei of the first kind into long-lived states (LLS) of nuclei of a second kind;
   d) sustaining these LLS by irradiation of the sample with an rf-field;
   e) at least partially converting the LLS into observable magnetisation; and
   f) carrying out an NMR or MRI measurement, wherein, in step e) the LLS are only partially converted into detectable magnetisation and, after carrying out step e), a remaining part of the LLS is sustained during a subsequent period, prior to another detection period, wherein steps d) through f) are repeated n−1 times, with n an integer number >1, wherein, in step e), the LLS are completely converted into a difference of longitudinal two spin order (ZZ) and zero quantum coherence (ZQC) during an interval $\tau_4$, and this superposition is subsequently partially converted into detectable magnetisation by applying a small-angle pulse.

2. The method of claim 1, wherein the nuclei of the first kind have a longitudinal relaxation time $T_1$ which is longer than a time required for the transfer of the polarised sample to room temperature.

3. The method of claim 2, wherein the nuclei of the first kind are $^{13}C$ or $^{15}N$ nuclei.

4. The method of claim 1, wherein the nuclei of the second kind are protons.

5. The method of claim 1, wherein the small angle pulse has a flip angle smaller or equal to 30°.

6. The method of claim 1, wherein creation of enhanced polarization of nuclei of a first kind is realized by dynamic nuclear polarization (DNP).

7. The method of claim 6, wherein the DNP is dissolution DNP.

8. The method of claim 1, wherein the method is used for study of chemical reactions and slow dynamic phenomena.

9. The method of claim 8, wherein the chemical reactions and slow dynamic phenomena comprise at least one of flow, diffusion, and exchange.

10. A method for nuclear magnetic resonance (NMR) or magnetic resonance imaging (MRI) measurements, the method comprising the steps of:
   a) creating enhanced Polarisation of nuclei of a first kind within a sample in a magnetic field at cryogenic temperatures;
   b) transferring the polarised sample to room temperature;
   c) transforming the enhanced polarization of nuclei of the first kind into long-lived states (LLS) of nuclei of a second kind;
   d) sustaining these LLS by irradiation of the sample with an rf-field;
   e) at least partially converting the LLS into observable magnetisation; and
   f) carrying out an NMR or MRI measurement, wherein, in step e) the LLS are only partially converted into detectable magnetisation and, after carrying out step e), a remaining part of the LLS is sustained during a subsequent period, prior to another detection period, wherein steps d) through f) are repeated n−1 times, with n an integer number >1, wherein, in step e), the LLS are partially converted into a difference of longitudinal two spin order (ZZ) and zero quantum coherence (ZQC) during an interval $\tau_0$, and this superposition is subsequently entirely converted into detectable magnetisation by applying a 90° pulse.

11. The method of claim 10, wherein the nuclei of the first kind have a longitudinal relaxation time $T_1$ which is longer than a time required for the transfer of the polarised sample to room temperature.

12. The method of claim 11, wherein the nuclei of the first kind are $^{13}C$ or $^{15}N$ nuclei.

13. The method of claim 10, wherein the nuclei of the second kind are protons.

14. The method of claim 10, wherein creation of enhanced polarization of nuclei of a first kind is realized by dynamic nuclear polarization (DNP).

15. The method of claim 14, wherein the DNP is dissolution DNP.

16. The method of claim 10, wherein the method is used for study of chemical reactions and slow dynamic phenomena.

17. The method of claim 16, wherein the chemical reactions and slow dynamic phenomena comprise at least one of flow, diffusion, and exchange.

* * * * *